United States Patent [19]

Mlavsky

[11] 4,078,944
[45] Mar. 14, 1978

[54] ENCAPSULATED SOLAR CELL ASSEMBLY

[75] Inventor: Abraham I. Mlavsky, Lincoln, Mass.

[73] Assignee: Mobil Tyco Solar Energy Corporation, Waltham, Mass.

[21] Appl. No.: 611,087

[22] Filed: Sep. 8, 1975

[51] Int. Cl.² .......................................... H01L 31/04
[52] U.S. Cl. ................................ 136/89 H; 250/239
[58] Field of Search ........................... 136/89, 89 H; 250/211 JR, 239

[56] References Cited

U.S. PATENT DOCUMENTS

| 866,462 | 9/1907 | Hammer | 136/89 X |
|---|---|---|---|
| 2,001,672 | 5/1935 | Carpenter | 136/89 X |
| 2,041,953 | 5/1936 | Praetorious et al. | 136/89 |
| 2,823,245 | 2/1958 | Solow | 136/89 |
| 2,994,054 | 7/1961 | Peterson | 338/19 |
| 3,117,295 | 1/1964 | Luft | 338/19 |
| 3,532,551 | 10/1970 | Webb | 136/89 |
| 3,533,850 | 10/1970 | Tarneja et al. | 136/89 |
| 3,990,914 | 11/1976 | Weinstein et al. | 136/89 |

Primary Examiner—John H. Mack
Assistant Examiner—Aaron Weisstuch
Attorney, Agent, or Firm—Schiller & Pandiscio

[57] ABSTRACT

An encapsulated photovoltaic solar cell assembly comprising at least one solar cell mounted and hermetically sealed in a substantially rigid, elongated, tubular envelope which is transmissive to actinic radiation to which the photovoltaic solar cell is sensitive. The assembly can include an antireflection coating for reducing the reflection of solar radiation from the envelope as well as reflective coatings for uniformly distributing solar radiation over the light gathering surfaces of the cell.

14 Claims, 5 Drawing Figures

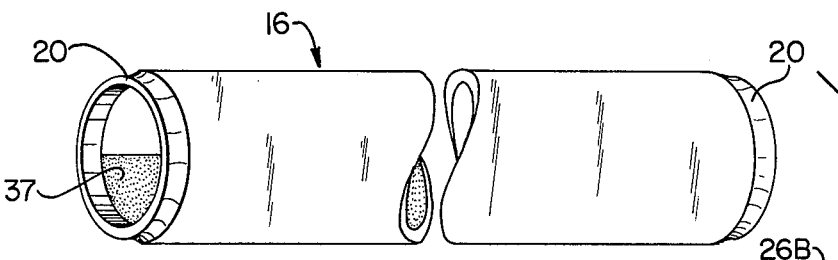
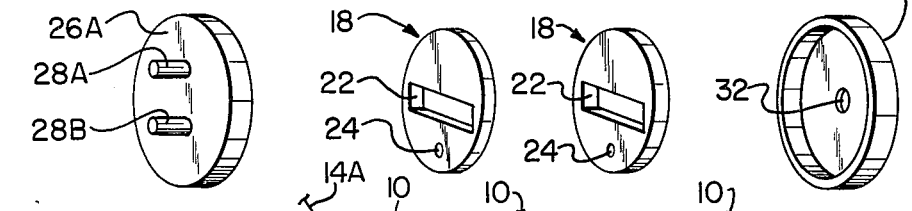
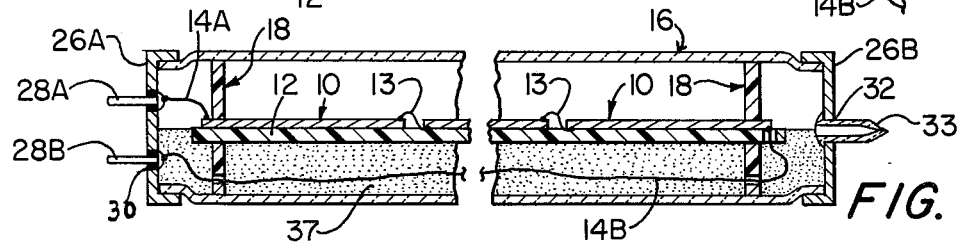
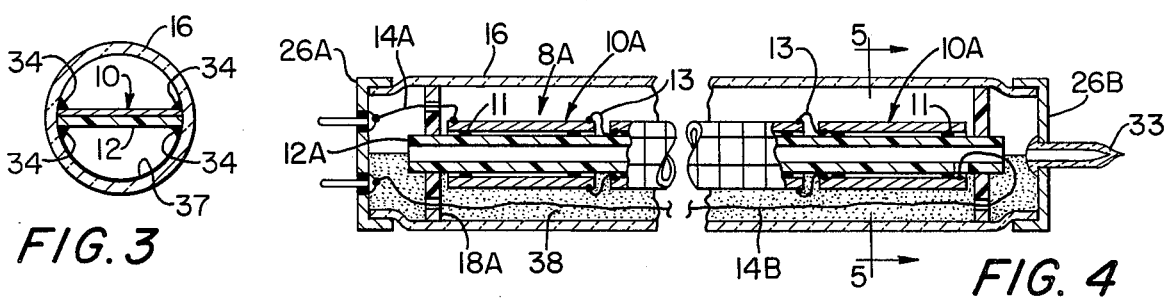
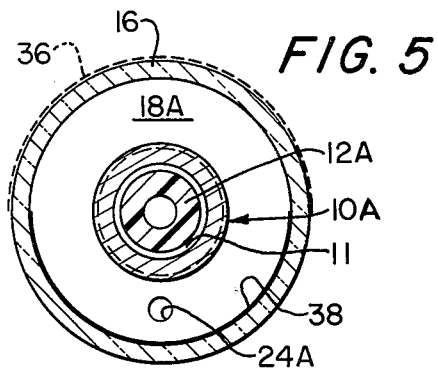

ENCAPSULATED SOLAR CELL ASSEMBLY

This invention relates to apparatus for converting solar energy into electrical energy and more particularly to improved encapsulating and supporting structures for solar cells and solar cell arrays.

Generally, a solar cell includes a semiconductor body having both $p$ and $n$-type semiconductive materials which form a P/N junction. It is well known that actinic radiation of an appropriate wavelength falling on this P/N junction serves as a source of external energy to generate hole-electron pairs in the body to produce a potential difference at the junction. The electrons and electron-holes thus in effect move across the junction in opposite directions to provide a source of electric current which is capable of delivering power to an external circuit. By interconnecting $p$ and $n$ regions of two or more solar cells by any interconnect methods which are presently known in the art, an array of solar cells can be provided which is useful for generating electrical power in terrestrial and space applications. Conventional silicon solar cells are flat and in making multi-cell power supplies it is customary to mount the cells on a printed circuit board which not only provides a support for the cells but also means for interconnecting the cells in a parallel and/or series arrangement. The board and cells are then mounted on a supporting frame so that the cell can be oriented with respect to the sun in any desired predetermined direction. In order to protect the cells from being damaged by environmental conditions such as excessive moisture, the cells and boards usually are "potted" or hermetically sealed in a material which is transmissive to the activating radiation but will protect the cells as well as the interconnections from adverse environmental conditions.

However, the prior art techniques of hermetically sealing the solar cells make such devices expensive to manufacture. Further, the potting compounds which are currently being used are not sufficiently stable against environmental conditions so as to maintain the hermetic seal over long periods of time. For example, almost all plastics will degrade when exposed to ultraviolet radiation for prolonged periods of time. Additionally, the encapsulant must be totally impervious to moisture, a requirement which is difficult to maintain when a twenty year life-expectancy is envisioned.

It is therefore a general object of the present invention to provide an encapsulating and supporting structure for solar cells and solar cell arrays which substantially avoids or overcomes a number of the problems encountered in the manufacture and use of solar cells constructed in accordance with prior art techniques.

More specific objects of the present invention are to provide an encapsulating and solar cell supporting structure which is relatively inexpensive to produce, is stable under most normally expected environmental conditions and particularly those encountered in terrestrial and space environments, and, will remain substantially impervious to moisture over relatively long periods of time.

Another object of the present invention is to provide a solar cell encapsulating support which has structural integrity and which can be made from existing commercially available materials at relatively low costs.

A further object of the present invention is to provide a hermetically-sealed, solar cell support structure which can be interconnected easily with similar structures and is adapted to accommodate various types of solar cells and solar cell arrays.

Yet another object of the present invention is to provide an improved solar cell encapsulating support which is adapted to maximize the intensity of radiation received by the cells.

In order to accomplish the foregoing objects, the present invention comprises an elongated solar cell structure mounted in a substantially rigid tubular envelope which is evacuated or else filled with an inert gas. The solar cell structure may consist of a single large cell but preferably it comprises a plurality of interconnected cells. The envelope is made of a material which is transmissive to radiation to which the cells are sensitive and is hermetically sealed off at each end by an end closure. One or both of the end closures includes terminal means for connection to the positive and negative leads of the solar cell structure. In one embodiment the solar cell structure is supported in the tubular envelope by at least two supporting elements which are positioned adjacent opposite ends of the envelope and include central apertures for receiving and supporting the solar cell structure within the envelope. In another embodiment the solar cell structure is supported directly and solely by the envelope. Means may be provided for concentrating received radiation on the light gathering surfaces of the cell structure.

Still other objects of the invention are set forth or rendered obvious by the following detailed description of the invention which should be considered together with the accompanying drawings, wherein:

FIG. 1 is a perspective view of the various components utilized in one embodiment of the present invention;

FIG. 2 is a longitudinal sectional view of the embodiment of FIG. 1 assembled for use;

FIG. 3 is a cross-sectional view of a second embodiment of the present invention;

FIG. 4 is a longitudinal sectional view of a third embodiment of the present invention; and FIG. 5 is a cross-sectional view taken along line 5—5 of FIG. 4.

In the several views, like numerals refer to like parts.

Solar cell structures made by various techniques may be used in the practice of this invention. While the structure may consist of a single solar cell, it is preferred that it consist of a plurality of solar cells interconnected in a series and/or parallel matrix. In this connection it is to be noted that it is common practice to fabricate solar cells as individual physical entities with light gathering surface areas in the order of 4–6 cm². For power generating applications a plurality of individually constructed solar cells are mounted in a flat array on a supporting substrate or panel so that their light gathering surfaces provide an approximation of a single large light gathering surface. Further, since each cell itself generates only a small amount of power (a silicon solar cell, for example, has an open circuit voltage potential of about 0.50 volts), a required voltage and/or current can be realized by interconnecting the cells of the array in a series and-/or parallel matrix. Other fabrication techniques also have been developed. For example, integrated solar cell panels can be formed wherein one region of semiconductivity of each of the cells of the panel is a continuous body of semiconductor material common to all the cells in the array. Another technique which is described in my copending U.S. application Ser. No. 519,920 filed Nov. 1, 1974 is predicated on the use of semiconductors which are grown in tubular form. Generally, a tubular body of either an *n* or *p*-type conductivity can be grown in accordance with processes well known in the art. See for example, U.S. Pat. Nos. 3,591,348; 3,826,625; 3,687,633; 3,870,477; 3,129,061; 3,162,507 and 3,394,994. The body is treated to provide a zone of opposite type conductivity so that a *p-n* junction is created between such zone and the adjacent portion or portions of the hollow body. The zone of opposite type conductivity may be formed in various ways known to persons skilled in the art, e.g. by diffusion or ion implantation of dopants or by epitaxial deposition of opposite type conductivity material. Further information regarding the construction and fabrication of solar cells and solar cell panels consisting of a plurality of solar cells is provided by U.S. Pat. Nos. 3,359,137; 3,575,721; 3,116,171; 3,150,999; 3,778,312; 3,502,507; 3,489,615; 3,378,407; 3,819,417; 3,546,542; 3,811,954; 3,457,427; 3,459,597; 3,411,050; 3,175,929; 3,361,594; 3,615,853; 3,682,708; 3,089,070; 3,574,925; 3,589,946; 3,686,036; 3,539,883 and 3,769,091. In all the techniques described a pair of electrodes is provided for each cell so as to collect current from the solar cell. One electrode typically comprises a grid of conductors applied to and forming an ohmic contact with the outer, light-gathering surface of the cell. The other electrode usually in the form of a continuous layer of electrically-conductive material is provided on and forms an ohmic contact with the cell's opposite surface.

Referring to FIGS. 1 and 2, the preferred embodiment is described as including an elongate, flat solar cell structure 8 which comprises a plurality of photovoltaic cells 10 of conventional construction which are preferably supported on a flat, rigid support member 12 so that the cells are spaced from one another to provide an elongated panel-like assembly. Although not shown in detail, it is to be understood that each cell 10 is constructed generally as shown in U.S. Pat. Nos. 3,686,036 and 3,811,954 and thus is a silicon *n-p* solar cell with one electrode attached to and covering most of the bottom surface thereof (i.e. the surface that faces the support member 12) and an electrode in the form of a grid attached to the opposite or upper surface thereof. The latter surface forms the radiation-receiving portion of the cell. The support member 12 is made of an electrically-insulating material and the bottom electrode of each cell 10 is connected to the top grid electrode of the next adjacent cell by a wire 13. Two terminal wires 14A and 14B are respectively connected to the top electrode of the cell at one end of the array and the bottom electrode of the cell at the other end of the cell array. Although only three cells are shown in FIGS. 1 and 2, it will be understood that the assembly may include any desired number of cells 10 and the manner in which they are interconnected can vary without departing from the scope of the present invention. Thus, for example, a plurality of cells can be mounted in parallel (i.e., the top electrodes of the cells are all connected together and to one of the terminal wires 14 while all the bottom electrodes of the cells are connected together and to the other terminal wire 14) or in a combined series and parallel matrix. Further, the support member 12 may include electrically-conductive material to interconnect the electrodes of the cells. Accordingly, support member 12 may be in the form of a printed circuit board.

The solar cell structure 8 is supported in an elongated, tubular envelope 16 by at least two mounting elements 18. The envelope 16 is made of a material which is substantially transmissive to radiation to which the solar cells 12 are sensitive. Preferably, the envelope is made of a clear vitreous or ceramic material which is transmissive to visible and ultraviolet radiation. The envelope 16 preferably comprises a cylindrical tube having a uniform wall thickness for structural integrity. The ends 20 of the envelope are preferably reduced in diameter so as to facilitate attachment of end caps as hereinbefore described, but the minimum inner diameter of the envelope is greater than the width of support member 12 so as to permit the structure 8 to be inserted into the envelope. Such envelopes are commercially-available and commonly used in certain gaseous-vapor discharge devices such as fluorescent lamps of the type employed for lighting living and work areas in buildings. Preferably each mounting element 18 is preferably in the form of a disc which is made of a resilient, electrically-insulative material and is sized so that it can be inserted into the envelope through the ends 20 and yet make a tight press fit with the interior surface of the tube when it is positioned so that its plane extends at a right angle to the longitudinal axis of the envelopes. The resiliency of the disc-like mounting elements 18 is advantageous where the assembly is subjected to relatively large temperature changes such as those encountered in space applications, since the mounting elements can yield to prevent buildup of stresses in the unit. Each member 18 includes an elongate centrally located aperture 22 which is sized and adapted to receive an end of the solar cell structure 8 and hold it centered on the longitudinal axis of the envelope. The mounting elements preferably include holes 24 to permit the terminal leads 14 to be brought out to one end of the envelope. The opposite ends of the envelope 14 are fitted with end closures or caps 26A and 26B. These caps may be made of any suitable material but preferably they are made of metal and are like the end caps which are used to close off the tubular envelopes of conventional fluorescent lamps. Cap member 26A is provided with two terminal posts 28A and 28B which are electrically connected by soldering or the like to the respective terminal leads 14A and 14B. Where the cap 26A is made of an electrically-conductive material, posts 28 are insulated from the cap by any suitable electrically-insulative material 30 as well known in the art, e.g. by glass seals. Caps 26A and 26B fit on the ends 20 of the envelope 16 and are hermetically sealed in place by means of a suitable cement or by a glass or ceramic bonding agent. Preferably, the sealed envelope is either evacuated to create a vacuum or is filled with an inert gas such as nitrogen. To this end the cap member 26B may be provided with a hollow fitting 32 which as installed is open at both ends so that it can be used for evacuating and filling purposes, after which its outer end is pinched off as shown at 33. Other techniques well known in the art may be employed for evacuating or filling the sealed envelope. For example, one of the terminal posts 28 can be made as a hollow member and its outer end pinched off after the evacuation or filling of the envelope has been completed.

When assembling the preferred device shown in FIGS. 1 and 2, the structure 8 is positioned in the envelope 16 by support elements 18, the terminal wires 14 are connected to the terminal posts 28 of the cap member 26A, and then the cap members are sealed in place. Thereafter the envelope is evacuated (or evacuated and filled with an inert gas) and the fitting 32 is pinched off to fully seal the envelope.

As an alternative measure, the support members 18 need not be resilient but instead may be stiff and may even be made of a ceramic material or glass, in which event they are sized so as to make a close but sliding fit with the envelope and are secured to the solar cell support member 12 so that they cannot move relative to the solar cell structure 8. Also in such event the support member 8 is made long enough to engage end caps 26, whereby it is restrained against lengthwise movement, and at least one end of tube 16 is not reduced in diameter so as to permit the members 18 to be inserted therein.

As a further alternative arrangement where the ends of the tube 16 are not reduced in size and the caps fit over and are sealed to the ends of the envelope, the mounting elements 18 may be omitted and the width of the structure 8 may be dimensioned so as to provide a close or tight fit with the interior surface of the envelope, as shown in FIG. 3. Alternatively or in addition to the friction fit, in order to insure that the structure 8 remains fixed with respect to the envelope, a cement material 34 may be utilized to secure the two together. Preferably, the arrangements shown in FIGS. 1-3 are further modified by applying a reflecting coating 37 to that portion of the inner surface of the tube 16 which confronts the solar cell support member 12. Alternatively the coating 27 may be applied to the corresponding portion of the outer surface of tube 12. In either case the coating 37 shields the support member 12 from direct radiation and thus helps to prevent it from beccoming overheated by directly received radiation.

The present invention also may be used to provide protection for tubular solar cell structures. As described in my corresponding U.S. application Ser. No. 519,920, such tubular cell structures comprise photovoltaic cells and a number of such structures may be physically attached end-to-end with appropriate means provided for series and/or parallel electrical connection of the cells. Thus, referring to FIGS. 4 and 5, a modification of the present invention is illustrated as including a tubular solar cell structure 8A which comprises an electrically-insulative tubular support member 12A with radial flanges 11 that engage and support the ends of a plurality of tubular photovoltaic cells 10A which are electrically-connected in series by wires 13. The outer grid electrode of each cell is connected to the inner electrode of the next adjacent cell so that the electrical potential between the terminal wire 14A attached to the outer grid electrode of the cell at one end of the structure and the terminal wire 14A attached to the inner electrode of the cell at the opposite end of the structure will equal the sum of the voltage potentials of the cells of the array. The mounting elements 18A differ from the elements 18 of FIG. 1 in that the central aperture is round and sized to receive the tubular support member 10A in a tight fit. The tubular structure 8A can thus be mounted and sealed within the envelope 16 in a manner similar to that described above with respect to FIGS. 1 and 2.

Although materials for the envelope 16 can be chosen which exhibit excellent radiation transmission characteristics, it is noted that some of the incoming solar radiation will be reflected off the outer surface of the envelope 16 and in the case of the tubular solar cell structure, some of the incoming radiation may pass through the envelope 16 without striking the outer light gathering surface of the solar cell structure. Consequently, the outer surface of the radiation-gathering portion of the envelope in FIGS. 4 and 5 can be provided with an antireflection coating such as the coating shown as 36. This coating may be provided around the entire outer surface of the envelope 16 where the incoming radiation is expected from all directions, as where a reflecting type light concentrator is used to collect and redistribute incoming radiation.

A further modification is to provide a reflective coating 38 on the inner surface of the lower half of the envelope, so that radiation passing through the upper half of the envelope which does not strike the light gathering surface of the structure 8A will be reflected back up to the lower half of that structure and therby provide a more uniform exposure of the solar cells to solar radiation. The reflective material may be any material which reflects a high percentage of solar radiation, e.g. a film of silver or even aluminum paint.

Although several embodiments of the present invention have been described in detail for mounting and encapsulating solar cell structures, other modifications can be made, without departing from the scope of the invention. For example, the disc-shaped mounting elements 18 and 18A may be omitted and grooves can be formed on the interior surface of the envelope which extend longitudinally and are sized to accept and interlock with the edges of support member 12. Alternatively, channel members can be attached to the inside of the cap members 26A and 26B which extend into the envelope 16 far enough to accept and interlock with the end edge portions of support member 12, whereby the solar cell structure is fixedly supported in the envelope by the end cap. Also one terminal lead 14A can be connected to a terminal pin on one end cap and the other terminal lead 14B can be connected to a terminal pin on the other end cap.

The advantages of the present invention are numerous. The tubular envelope can be made of the same glass as is used to make conventional fluorescent lamp tubes and in fact it may be preferred for reasons of economy to use glass tubes of the type regularly made for fluorescent lamps, omitting of course the fluorescent coating that is part of a fluorescent lamp tube. (Alternatively, one may employ a glass composition which has a higher overall optical transmission for the solar spectrum, for example, pyrex.) Such tubes have excellent structural integrity and dimensional stability and the techniques for bonding end caps in place and evacuating and filling the tubes are well established in the lamp art. The tubular envelopes are highly resistant to degradation from light or heat and are easy to handle and to mount to a suitable supporting structure. Furthermore plug and socket type connectors may be used to connect the two or more units together via the terminal pins 28. Still other advantages and possible modifications will be obvious to persons skilled in the art.

What is claimed is:

1. A solar cell assembly comprising, in combination:
   a hollow, elongated tubular glass envelope transmissive to said solar radiation and having a reduced diameter at each of the opposite ends thereof;
   at least one solar cell sensitive to solar radiation supported and totally disposed within said envelope;
   a pair of closed metal end caps attached to and hermetically sealing said reduced diameter ends of said envelope; and
   terminal pins carried by and extending through at least one of said end caps so as to connect said at least one solar cell to an electrical circuit disposed externally of said envelope.

2. A solar cell assembly according to claim 1 wherein said solar cell is a substantially flat unit.

3. A solar cell assembly according to claim 2 wherein said supporting means includes a substantially flat rigid member for supporting said solar cell, said member having a width dimensioned to provide a substantially close fit with the interior wall of said envelope.

4. A solar cell assembly according to claim 1 wherein said solar cell is a substantially cylindrical unit.

5. A solar cell assembly according to claim 1 further including an anti-reflection coating on a surface of said envelope.

6. A solar cell assembly according to claim 1 further including a reflective coating on a portion of said envelope.

7. A solar cell assembly according to claim 1 wherein said envelope is substantially cylindrical.

8. An assembly in accordance with claim 1, wherein said envelope is evacuated to create a vacuum.

9. An assembly in accordance with claim 1, wherein said envelope is filled with an inert gas.

10. A solar cell assembly comprising, in combination:
at least one solar cell sensitive to solar radiation;
a hollow, elongated tubular envelope transmissive to said solar radiation;
supporting means including at least one disc disposed within said envelope and cooperating with the interior surface of said envelope for supporting said at least one solar cell within said envelope; said disc including an aperture, said solar cell extending through said aperture;
means for hermetically sealing said envelope; and
means for electrically connecting said at least one solar cell to an electrical circuit disposed externally of said envelope.

11. A solar cell assembly according to claim 10, wherein said supporting means comprises at least two discs supporting said solar cell in said envelope at spaced-apart positions along the elongated axis of said envelope.

12. A solar cell assembly according to claim 10, wherein said disc makes a press fit with the interior surface of said envelope.

13. A solar cell assembly according to claim 12, wherein said disc is resilient.

14. A solar cell assembly according to claim 10, wherein said disc makes a sliding fit with the interior surface of said envelope.

* * * * *